United States Patent
Chu et al.

(10) Patent No.: US 9,761,522 B2
(45) Date of Patent: Sep. 12, 2017

(54) WIRELESS CHARGING PACKAGE WITH CHIP INTEGRATED IN COIL CENTER

(71) Applicant: Taiwan Semiconductor Manufacturing Company, Ltd., Hsin-Chu (TW)

(72) Inventors: Chiang-Jui Chu, Hsin-Chu (TW); Chen-Hua Yu, Hsin-Chu (TW); Chung-Shi Liu, Hsin-Chu (TW); Hao-Yi Tsai, Hsin-Chu (TW); Ming Hung Tseng, Toufen Township (TW); Hung-Yi Kuo, Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/169,838

(22) Filed: Jun. 1, 2016

(65) Prior Publication Data
US 2017/0221819 A1    Aug. 3, 2017

Related U.S. Application Data

(60) Provisional application No. 62/288,831, filed on Jan. 29, 2016.

(51) Int. Cl.
| | |
|---|---|
| H01L 29/00 | (2006.01) |
| H01L 23/522 | (2006.01) |
| H01L 23/31 | (2006.01) |
| H01L 23/498 | (2006.01) |
| H01L 25/065 | (2006.01) |

(Continued)

(52) U.S. Cl.
CPC ...... *H01L 23/5227* (2013.01); *H01L 21/4846* (2013.01); *H01L 21/4853* (2013.01); *H01L 21/56* (2013.01); *H01L 23/3157* (2013.01); *H01L 23/498* (2013.01); *H01L 23/5223* (2013.01); *H01L 25/0655* (2013.01); *H01L 25/50* (2013.01); *H01L 28/10* (2013.01); *H01L 28/40* (2013.01); *H01L 2225/0651* (2013.01)

(58) Field of Classification Search
CPC . H01L 23/5227; H01L 28/10; H01L 21/4846; H01L 25/50; H01L 21/56; H01L 21/4853
USPC .......................................................... 257/531
See application file for complete search history.

(56) References Cited

U.S. PATENT DOCUMENTS

| | | | | |
|---|---|---|---|---|
| 7,626,548 | B2 * | 12/2009 | Matsushita | ...... G06K 19/07749 343/700 MS |
| 8,361,842 | B2 | 1/2013 | Yu et al. | |

(Continued)

FOREIGN PATENT DOCUMENTS

| | | |
|---|---|---|
| TW | 201401461 A | 1/2014 |
| TW | 201448124 A | 12/2014 |

*Primary Examiner* — Luan C Thai
(74) *Attorney, Agent, or Firm* — Slater Matsil, LLP

(57) ABSTRACT

A package includes a device die, and an encapsulating material encapsulating the device die therein. The encapsulating material has a top surface coplanar with a top surface of the device die. A coil extends from the top surface to a bottom surface of the encapsulating material, and the device die is in the region encircled by the coil. At least one dielectric layer is formed over the encapsulating material and the coil. A plurality of redistribution lines is in the at least one dielectric layer. The coil is electrically coupled to the device die through the plurality of redistribution lines.

20 Claims, 18 Drawing Sheets

(51) Int. Cl.
*H01L 25/00* (2006.01)
*H01L 49/02* (2006.01)
*H01L 21/48* (2006.01)
*H01L 21/56* (2006.01)

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,789,762 B2 * | 7/2014 | Finn ............... G06K 19/07718 235/492 |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,890,285 B2 | 11/2014 | O'Donnell et al. |
| 8,991,712 B2 * | 3/2015 | Finn ............... G06K 19/07794 235/492 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0076617 A1 * | 3/2014 | Chen ............... H01L 25/105 174/255 |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

* cited by examiner

WIRELESS CHARGING PACKAGE WITH CHIP INTEGRATED IN COIL CENTER

PRIORITY CLAIM AND CROSS-REFERENCE

This application claims the benefit of the following provisionally filed U.S. Patent application: Application Ser. No. 62/288,831, filed Jan. 29, 2016, and entitled "InFO_WC with Chip Integrated in Coil Center;" which application is hereby incorporated herein by reference.

BACKGROUND

Wireless charging has become an increasingly popular charging technology. Wireless charging is sometimes known as inductive charging, which uses an electromagnetic field to transfer energy between an energy transmitter and an energy receiver. The Energy is sent through inductive coupling to an electrical device, which can then use that energy to charge batteries or run the device. Induction chargers use a first induction coil to create an alternating electromagnetic field from the transmitter and a second induction coil to receive the power from the electromagnetic field. The second induction coil converts the energy back into electric current, which is then used to charge a battery or directly drive electrical devices. The two induction coils, when proximal to each other, form an electrical transformer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
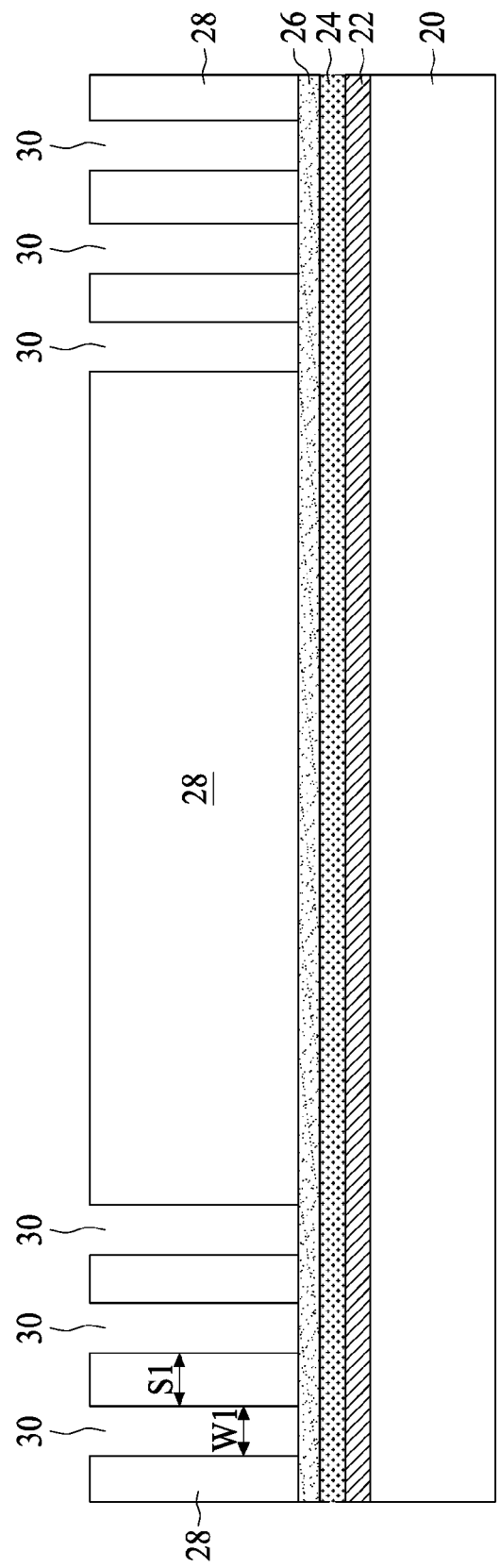
FIGS. 1 through 14 illustrate the cross-sectional views of intermediate stages in the formation of some packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package for wireless charging, which includes an AC-DC converter circuit chip and/or a Bluetooth circuit chip, is provided in accordance with various exemplary embodiments. The intermediate stages of forming the package are illustrated. Some variations of some embodiments are discussed. Throughout the various views and illustrative embodiments, like reference numbers are used to designate like elements.

Figure 16:
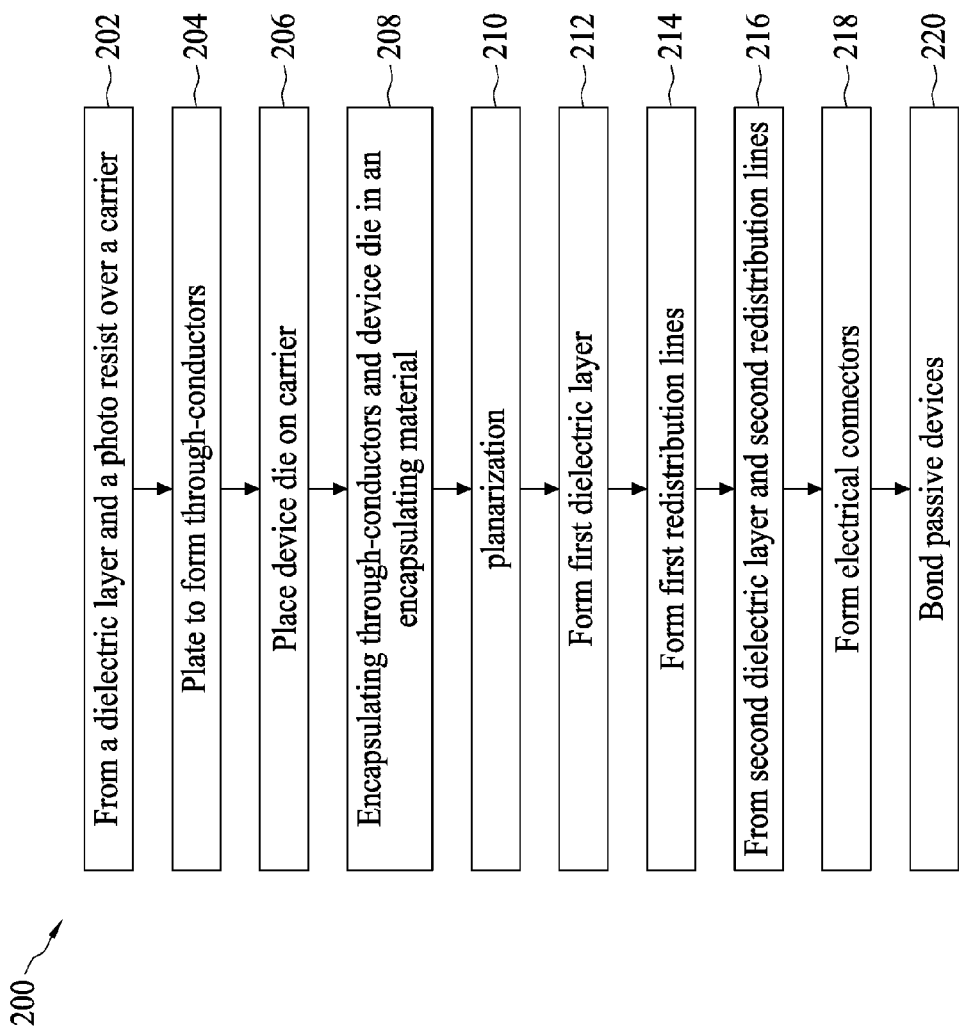
FIG. 16 illustrates a process flow for forming a package in accordance with some embodiments.

FIGS. 1 through 14 illustrate the cross-sectional views of intermediate stages in the formation of some packages in accordance with some embodiments of the present disclosure. The steps shown in FIG. 1 through 14 are also schematically illustrated in the process flow 200 shown in FIG. 16.

FIG. 1 illustrates carrier 20 and release layer 22 formed over carrier 20. Carrier 20 may be a glass carrier, a ceramic carrier, or the like. Carrier 20 may have a round top-view shape, and may have a size of a silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In accordance with some embodiments of the present disclosure, release layer 22 is formed of an epoxy-based thermal-release material. In accordance with some embodiments of the present disclosure, release layer 22 is formed of an ultra-violet (UV) glue. Release layer 22 may be dispensed as a liquid and cured. In accordance with alternative embodiments of the present disclosure, release layer 22 is a laminate film and is laminated onto carrier 20. The top surface of release layer 22 is leveled and has a high degree of co-planarity.

In accordance with some embodiments of the present disclosure, dielectric layer 24 is formed over release layer 22. The respective step is shown as step 202 in the process flow shown in FIG. 16. In the final product, dielectric layer 24 may be used as a passivation layer to isolate the overlying metallic features from the adverse effect of moisture and other detrimental substances. Dielectric layer 24 may be formed of a polymer, which may also be a photo-sensitive material such as polybenzoxazole (PBO), polyimide, benzocyclobutene (BCB), or the like. In accordance with alternative embodiments of the present disclosure, dielectric layer 24 is formed of an inorganic material(s), which may be a nitride such as silicon nitride, an oxide such as silicon oxide, PhosphoSilicate Glass (PSG), BoroSilicate Glass (BSG), Boron-doped PhosphoSilicate Glass (BPSG), or the like. In accordance with yet alternative embodiments of the present disclosure, no dielectric layer 24 is formed. Accordingly, dielectric layer 24 is shown with dashed lines to indicate that it may or may not be formed.

Figure 2:
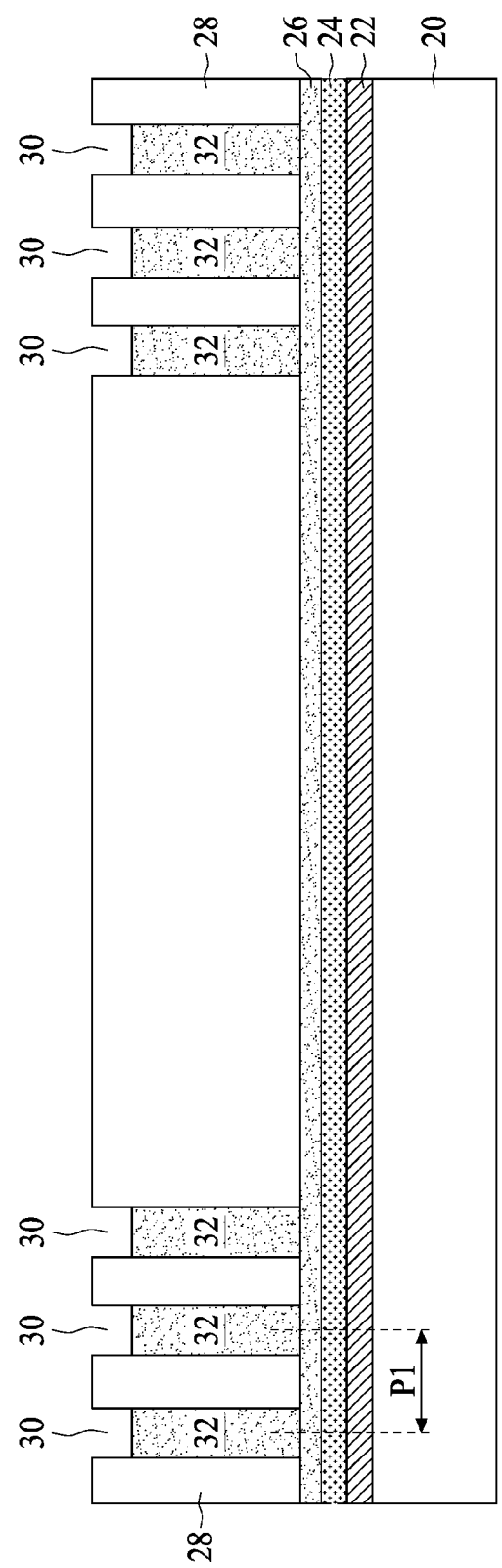
Figure 3:
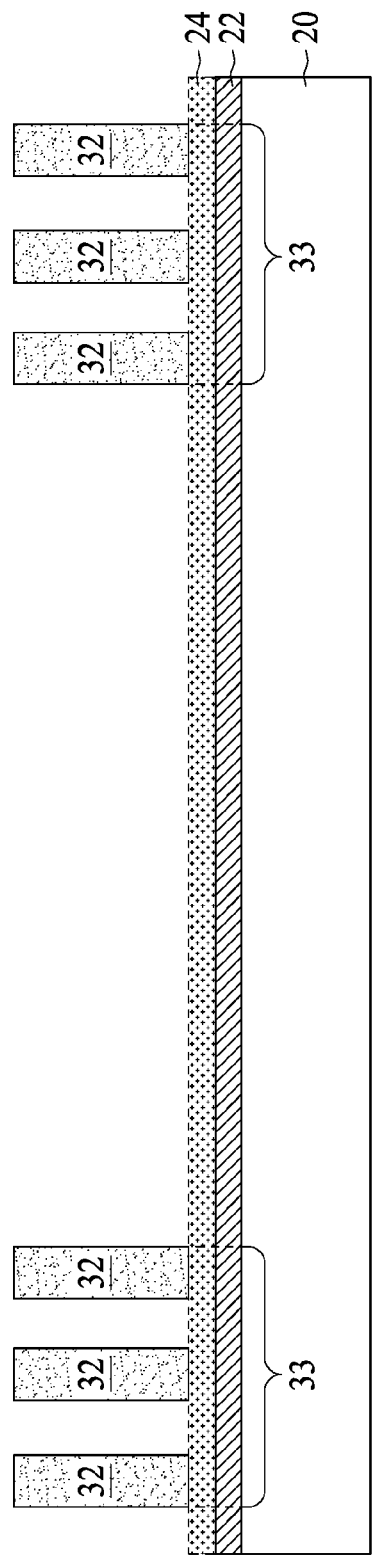

FIGS. 2 and 3 illustrate the formation of conductive features 32, which are referred to as through-conductors hereinafter since they penetrate through the encapsulation material 52 (FIG. 6) that will be dispensed in subsequent steps. Referring to FIG. 2, seed layer 26 is formed over dielectric layer 24, for example, through Physical Vapor Deposition (PVD) or metal foil lamination. Seed layer 26 may be formed of copper, aluminum, titanium, or multi-layers thereof. In accordance with some embodiments of the present disclosure, seed layer 26 includes a titanium layer (not separately shown) and a copper layer (not separately shown) over the titanium layer. In accordance with alternative embodiments, seed layer 26 includes a single copper layer.

Photo resist 28 is applied over seed layer 26 and is then patterned. The respective step is also shown as step 202 in the process flow shown in FIG. 16. As a result, openings 30 are formed in photo resist 28 by light-exposure and development steps. Some portions of seed layer 26 are exposed through openings 30.

Figure 13:
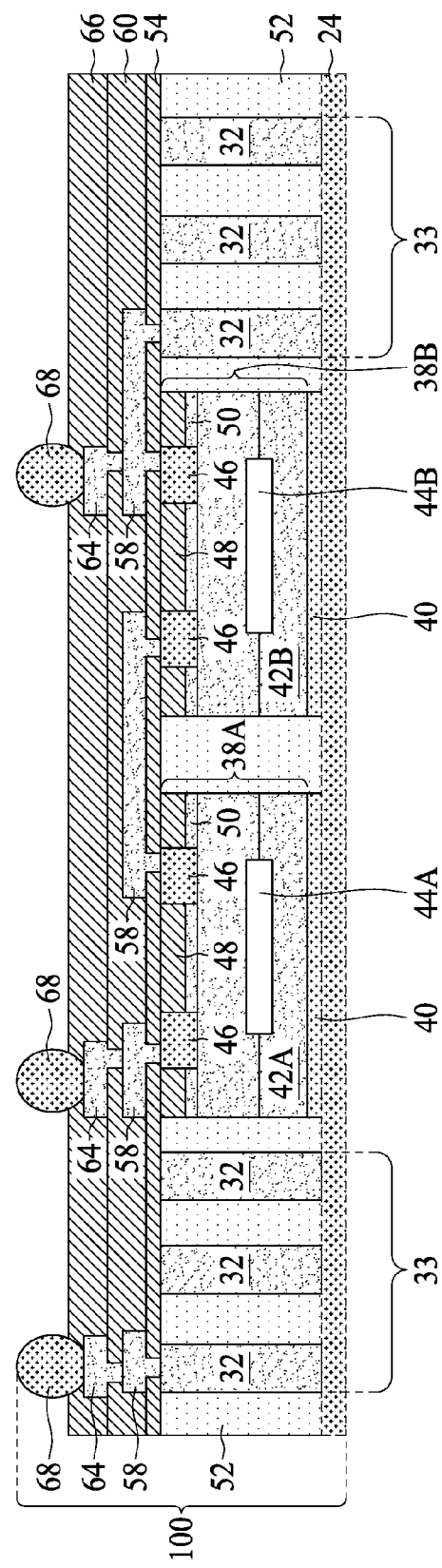
Figure 15:
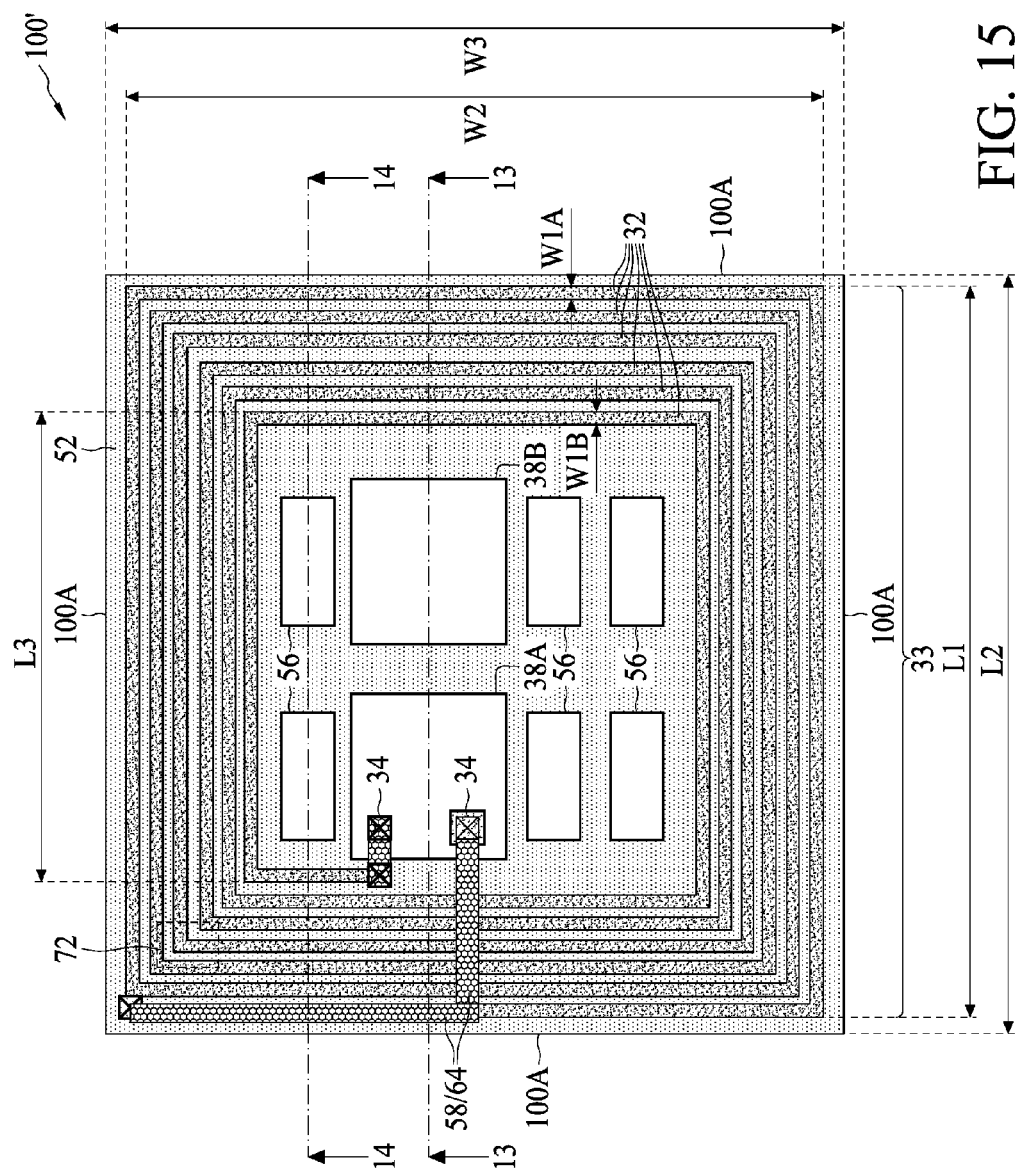
FIG. 15 illustrates a top view of a package in accordance with some embodiments.

In accordance with some embodiments of the present disclosure, openings 30 are used for forming coil 33 (FIG. 15), which may be used as a receiver for receiving energy in wireless charging. To improve the efficiency of receiving energy, the pitch P1 of openings 30 is designed and implemented to be as small as possible. For example, in accordance with some embodiments of the present application, pitch P1 is smaller than about 300 μm. As shown in FIG. 15, coil 33 has four sides, each being very long (compared to its widths). Furthermore, as shown in FIG. 13, conductors 32, which in combination form coil 33 as in FIG. 15, have high aspect ratios. Accordingly, it is difficult to form a long, narrow, and low-pitch coil. In accordance with some embodiments of the present application, photo resist 28 is selected according to the design of coil 33 such as the shape, the size, the height (in the cross-sectional view as in FIG. 13), and the size and the shape of the region encircled by coil 33. An exemplary method of finding proper photo resist material includes determining the resolution of a plurality of candidate photo resist materials, using matrix evaluation to determine the resolution of the candidate photo resist materials, finding appropriate photo resists from the candidate photo resist materials that have the desirable resolution, and then performing experiments to test which of the selected photo resists can meet the design requirement. It is realized, however, that the type of proper photo resist material is related to various factors as discussed, and a photo resist suitable for one design may not be suitable for other designs.

Referring back to FIG. 1, with photo resist 28 being formed of a proper material, the pitch P1 of openings 30 may be low enough, so that the overall efficiency of coil 33 for receiving energy may be high enough to meet design requirement. In accordance with some embodiments of the present disclosure, openings 30 have widths W1 smaller than about 300 μm, and spacing S1 between neighboring openings 30 may also be smaller than about 300 μm. Accordingly, pitch P1 may be smaller than about 600 μm.

Next, as also shown in FIG. 2, through-conductors 32 are formed in openings 30 through plating, which may be electro plating or electro-less plating. The respective step is shown as step 204 in the process flow shown in FIG. 16. Through-conductors 32 are plated on the exposed portions of seed layer 26. Through-conductors 32 may include copper, aluminum, tungsten, nickel, or alloys thereof. The top-view shapes of through-conductors 32 include, and are not limited to, spirals, rings, rectangles, squares, circles, and the like, depending on the intended function of through-conductors 32 and available space. The heights of through-conductors 32 are determined by the thickness of the subsequently placed integrated circuit chips (device dies) 38 (FIG. 5, including 38A and 38B), with the heights of through-conductors 32 being greater than or equal to the thicknesses of device dies 38 in accordance with various embodiments.

After the plating of through-conductors 32, photo resist 28 is removed, and the resulting structure is shown in FIG. 3. The portions of seed layer 26 (FIG. 2) that were previously covered by photo resist 28 are exposed. An etch step is then performed to remove the exposed portions of seed layer 26, wherein the etching may be an anisotropic or isotropic etching. The portions of seed layer 26 that are overlapped by through-conductors 32, on the other hand, remain not etched. Throughout the description, the remaining underlying portions of seed layer 26 are considered as being the bottom portions of through-conductors 32. When seed layer 26 is formed of a material similar to or the same as that of the respective overlying through-conductors 32, seed layer 26 may be merged with through-conductors 32 with no distinguishable interface therebetween. Accordingly, seed layers 26 are not shown in subsequent drawings. In accordance with alternative embodiments of the present disclosure, there exist distinguishable interfaces between seed layer 26 and the overlying plated portions of through-conductors 32.

The top-view shape of through-conductors 32 is related to, and is determined by, their intended function. In accordance with some exemplary embodiments in which through-conductors 32 are used to form an inductor, the illustrated through-conductors 32 may be a part of coil 33. FIG. 15 illustrates the top view of an exemplary inductor in accordance with some exemplary embodiments. In FIG. 15, through-conductors 32 in combination form a spiral, with two ports 34 connected to the opposite ends of the spiral. In accordance with alternative embodiments (not shown), through-conductors 32 form a plurality of concentric rings, with the outer rings encircling the inner rings. The rings have breaks to allow the outer rings to be connected to the inner rings through bridges, and the plurality of rings is serially connected to two ports 34. Ports 34 are also connected to semiconductor chip 38A.

Figure 4:
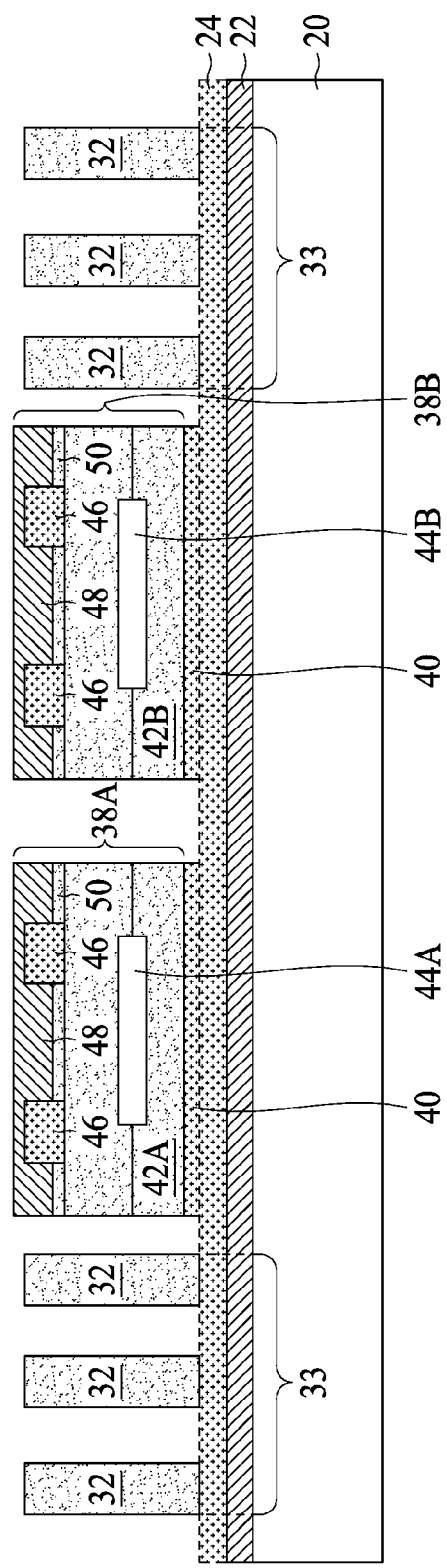

FIG. 4 illustrates the placement of device dies 38 (including 38A and 38B) over carrier 20. The respective step is shown as step 206 in the process flow shown in FIG. 16. Device dies 38 may be adhered to dielectric layer 24 through Die-Attach Films (DAF) 40, which are adhesive films. In accordance with some embodiments of the present disclosure, device dies 38 include AC-DC converter chip 38A, which has the function of receiving the AC current from coil 33, and converting the AC current to a DC current. The DC current is used to charge a battery (not shown), or to drive circuits of the respective product, in which the package including coil 33 is located.

Device dies 38 may also include communication die 38B, which may be Bluetooth Low-Energy (BLE) die. BLE die 38B may have the function of communicating with a transmitter (not shown), for example, through Bluetooth technology. The transmitter and BLE die 38B may negotiate the transmission of energy, for example, when the distance between the transmitter and coil 33 is small enough, and/or when the stored power in the battery is lower than a pre-determined threshold level. The transmitter may than start transmitting energy, which may be in the form of magnetic field at a high frequency, for example, at about 6.78 MHz. Coil 33 receives the energy, and feed the respective current to AC-DC converter chip 38A.

In accordance with some embodiments of the present disclosure, the formation of the package is at wafer-level. Accordingly, a plurality of coils 33 is formed simultaneously, each encircling an inner region. A plurality of device dies 38 is placed on carrier 20. For example, each of the coils 33 encircles one device die 38A and one device die 38B therein. The plurality of coils 33 and device dies 38 are allocated as an array having a plurality of rows and columns.

Device dies 38 may include semiconductor substrates 42A and 42B, respectively, which may be silicon substrates. Integrated circuit devices 44A and 44B are formed on semiconductor substrates 42A and 42B, respectively. Integrated circuit devices 44A and 44B include active devices such as transistors and diodes, and may or may not include passive devices such as resistors, capacitors, inductors, or the like. Device dies 38 may include metal pillars 46 electrically coupled to the respective integrated circuit devices 44A and 44B. Metal pillars 46 may be embedded in dielectric layer 48, which may be formed of PBO, polyimide, or BCB, for example. Passivation layers 50 are also illustrated, wherein metal pillars 46 may extend into passivation layers 50. Passivation layers 50 may be formed of silicon nitride, silicon oxide, or multi-layers thereof.

Figure 5:
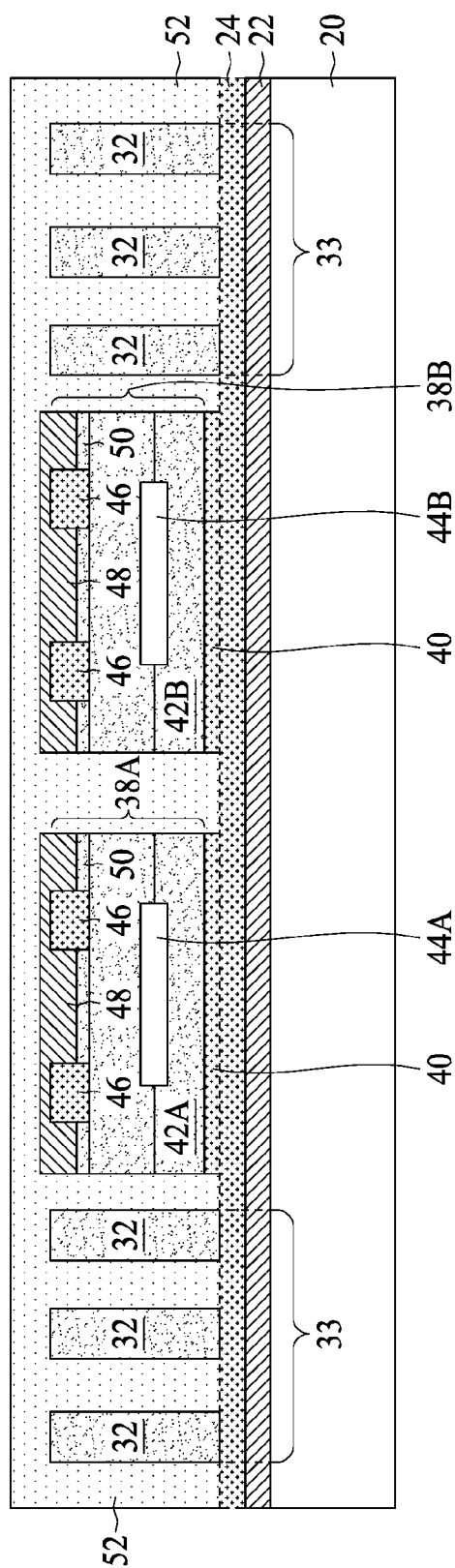

Next, referring to FIG. 5, encapsulating material 52 is encapsulated (sometimes referred to as molded) on device dies 38. The respective step is shown as step 208 in the process flow shown in FIG. 16. Encapsulating material 52 fills the gaps between neighboring through-conductors 32 and the gaps between through-conductors 32 and device dies 38. Encapsulating material 52 may include a polymer-based material, and may include a molding compound, a molding underfill, an epoxy, and/or a resin. The top surface of encapsulating material 52 is higher than the top ends of metal pillar 46.

Figure 6:
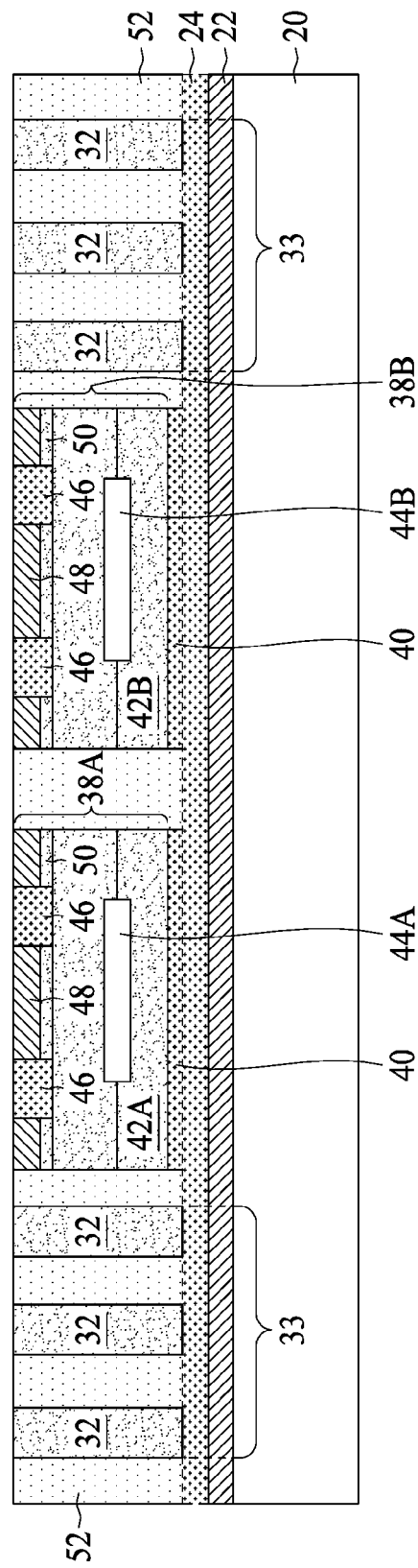

In a subsequent step, as shown in FIG. 6, a planarization process such as a Chemical Mechanical Polish (CMP) process or a grinding process is performed to reduce the top surface of encapsulating material 52, until through-conductors 32 and metal pillar 46 are exposed. The respective step is shown as step 210 in the process flow shown in FIG. 16. Due to the planarization, the top ends of through-conductors 32 are substantially level (coplanar) with the top surfaces of metal pillars 46, and are substantially coplanar with the top surface of encapsulating material 52.

Figure 14:
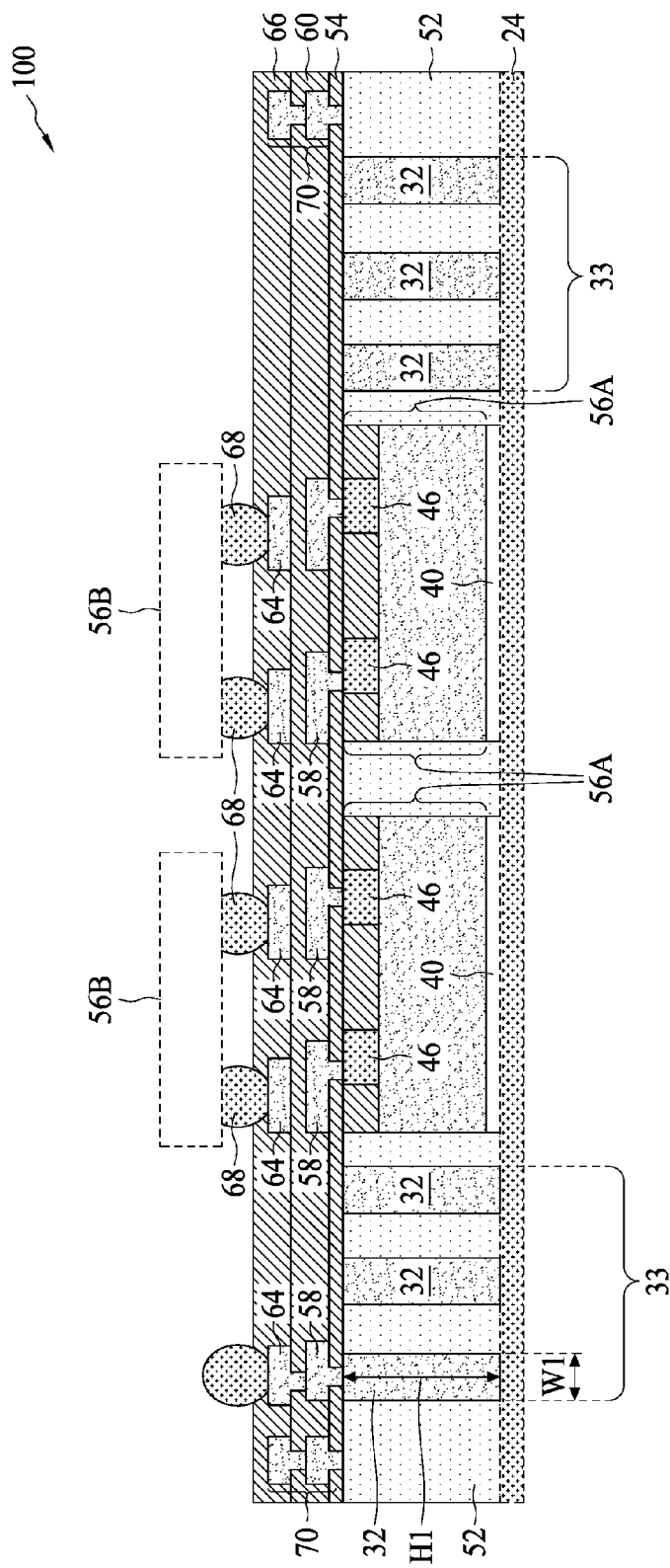

In accordance with some embodiments of the present disclosure, device dies 38 are embedded in encapsulating material 52, as shown in FIG. 6. Passive devices 56 (marked as 56A) may also be placed on carrier 20 before the encapsulation step as shown in FIG. 5. The respective passive devices 56 are shown in FIG. 14, which also illustrates more features formed in subsequent steps. Passive devices 56A may be capacitors, resistors, inductors, and/or the like. The surface conductive features 46 of passive devices 56A are also exposed in the planarization step as shown in FIG. 6. Accordingly, passive devices 56A are electrically coupled to other devices through the subsequently formed Redistribution Lines (RDLs). Passive devices 56A may be Integrated Passive Devices (IPDs), which are formed on semiconductor substrates in the respective chips. Throughout the description, an IPD may be a single-device chip, which may include a single passive device such as an inductor, a capacitor, a resistor, or the like, with no other passive devices and active devices in the respective chip. Furthermore, in accordance with some embodiments, there are no active devices such as transistors and diodes in IPDs 56A.

In accordance with alternative embodiments, there is no passive device encapsulated in encapsulating material 52. Accordingly, in FIG. 14, passive devices 56A are illustrated using dashed lines to indicate passive devices may be or may not be embedded in encapsulating material 52.

Figure 7:
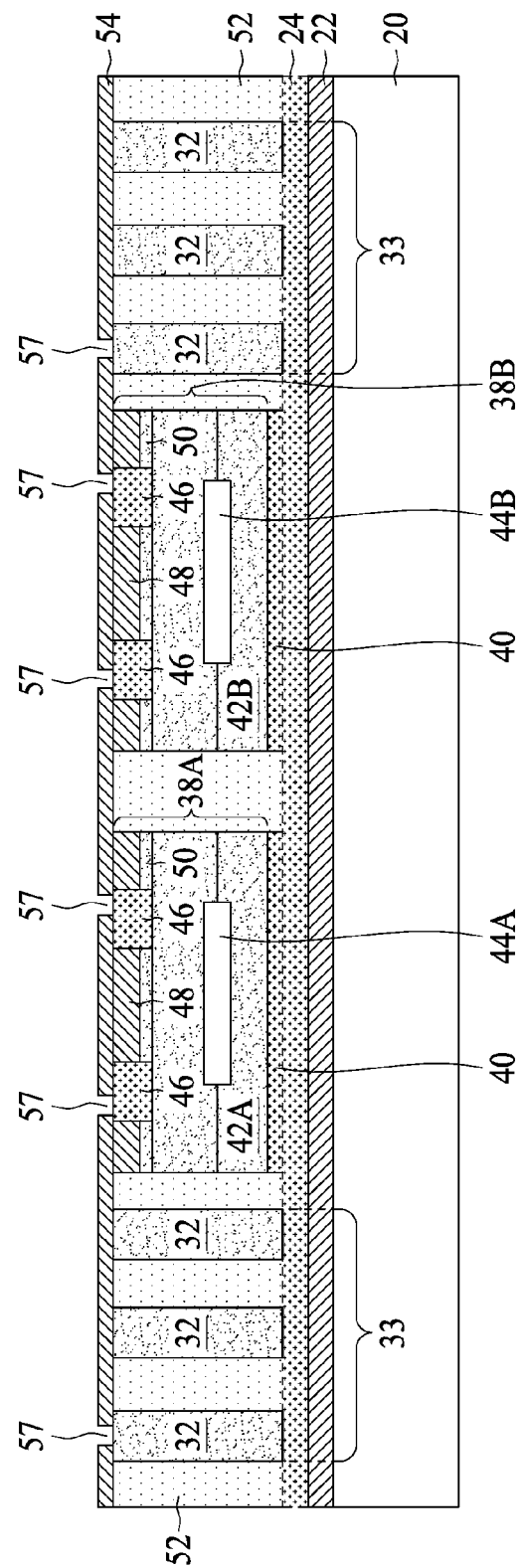

FIGS. 7 through 11 illustrate the formation of front-side RDLs and the respective dielectric layers. Referring to FIG. 7, dielectric layer 54 is formed. The respective step is shown as step 212 in the process flow shown in FIG. 16. In accordance with some embodiments of the present disclosure, dielectric layer 54 is formed of a polymer such as PBO, polyimide, or the like. In accordance with alternative embodiments of the present disclosure, dielectric layer 54 is formed of an inorganic material such as silicon nitride, silicon oxide, or the like. Openings 57 are formed in dielectric layer 54 (for example, through exposure and development) to expose through-conductors 32 and metal pillars 46. Openings 57 may be formed through a photo lithography process.

Figure 8:
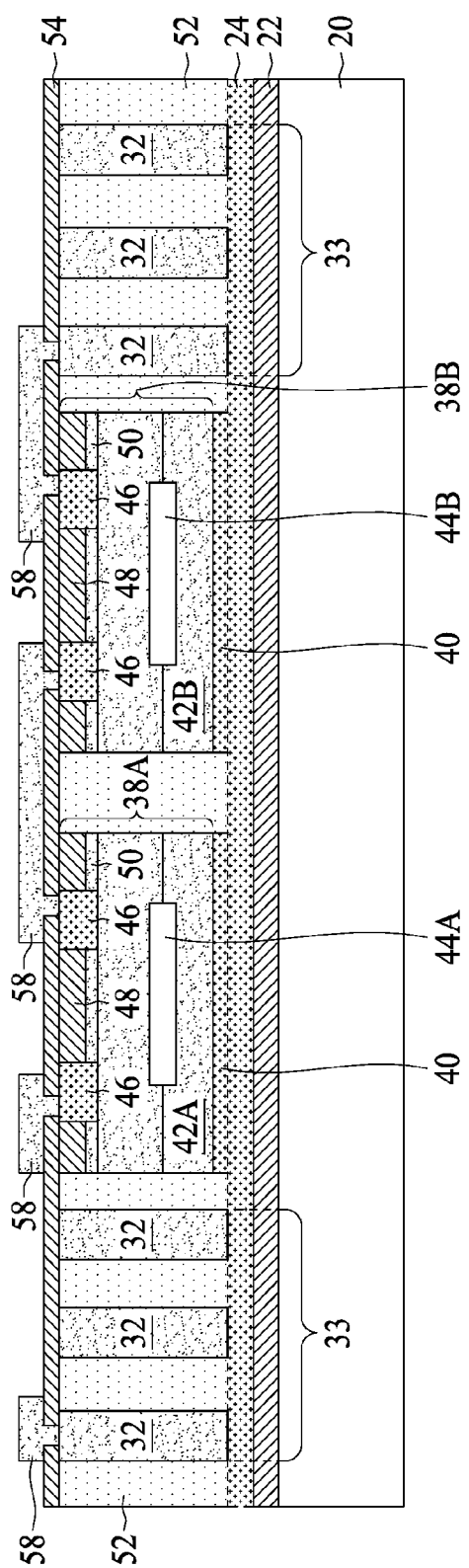

Next, referring to FIG. 8, Redistribution Lines (RDLs) 58 are formed to connect to metal pillars 46 and through-conductors 32. The respective step is shown as step 214 in the process flow shown in FIG. 16. RDLs 58 may also interconnect metal pillars 46 and through-conductors 32. In addition, RDLs 58 may be used to form the connection for connecting ports 34 (FIG. 15) of inductor 33 to device die 38A. RDLs 58 include metal traces (metal lines) over dielectric layer 54 and vias extending into dielectric layer 54. The vias in RDLs 58 are connected to through-conductors 32 and metal pillars 46. In accordance with some embodiments of the present disclosure, the formation of RDLs 58 includes forming a blanket copper seed layer, forming and patterning a mask layer over the blanket copper seed layer, performing a plating to form RDLs 58, removing the mask layer, and etch the portions of the blanket copper seed layer not covered by RDLs 58. RDLs 58 may be formed of a metal or a metal alloy including aluminum, copper, tungsten, and/or alloys thereof.

Figure 9:
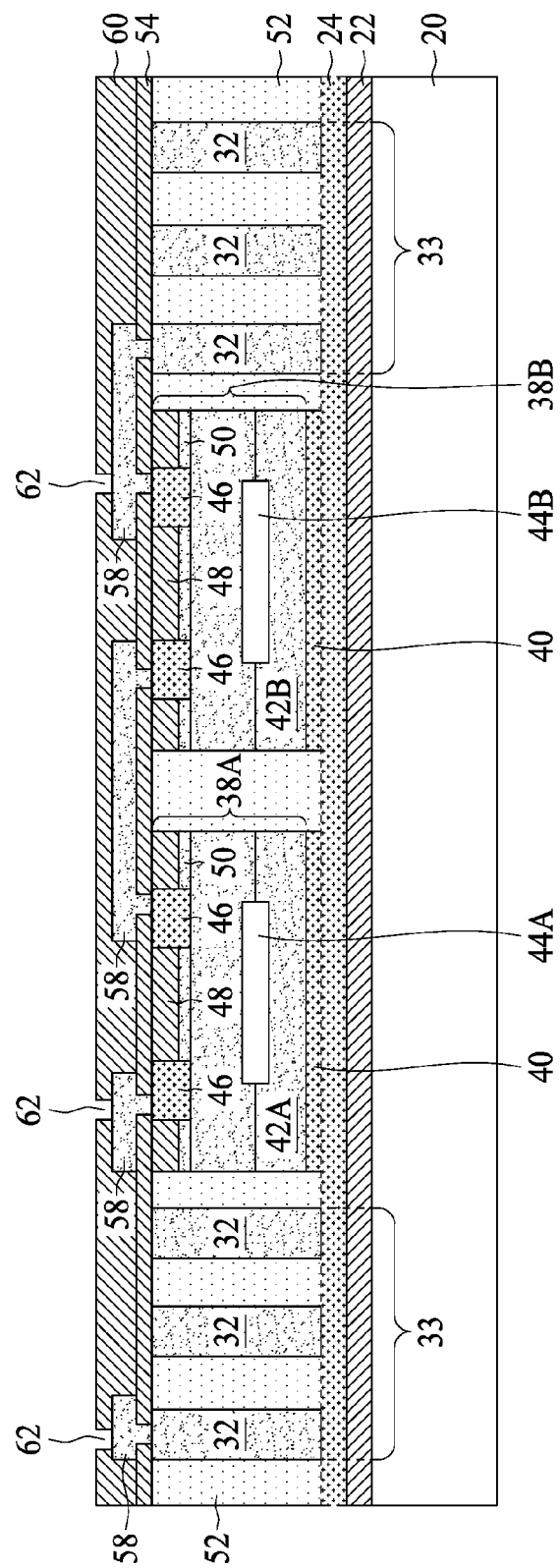

Referring to FIG. 9, in accordance with some embodiments of the present disclosure, dielectric layer 60 is formed over the structure shown in FIG. 8, followed by the formation of openings 62 in dielectric layer 60. Some portions of RDLs 58 are thus exposed. The respective step is shown as step 216 in the process flow shown in FIG. 16. Dielectric layer 60 may be formed using a material selected from the same candidate materials for forming dielectric layer 54.

Figure 10:
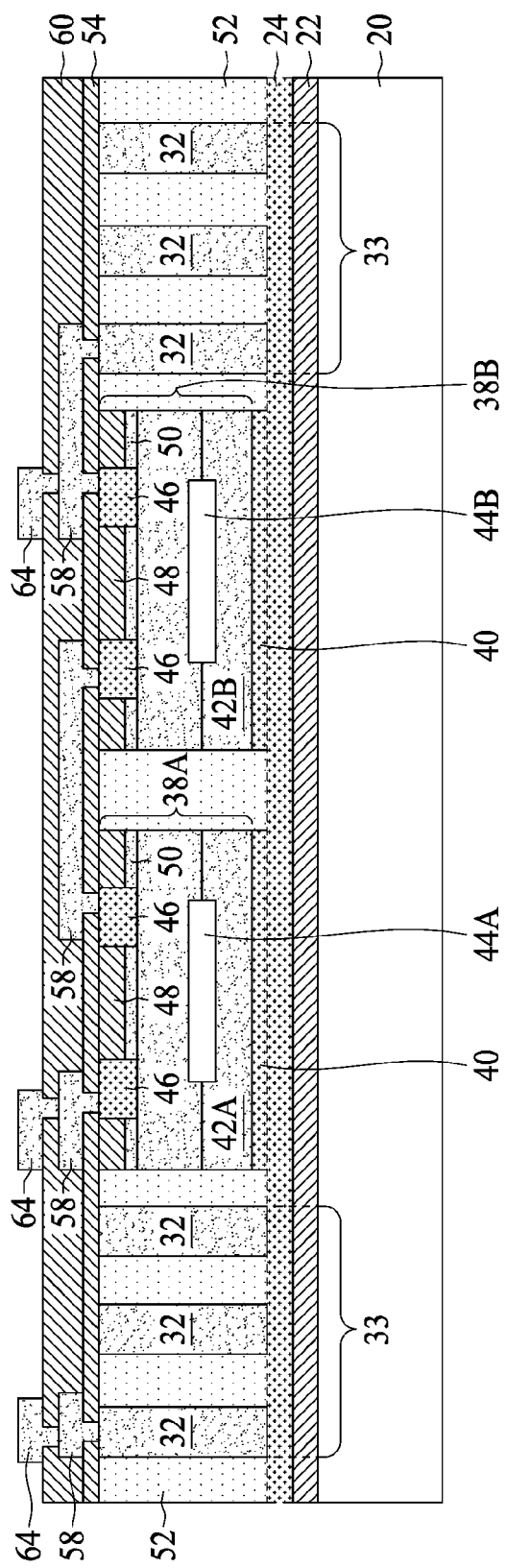

Next, as shown in FIG. 10, RDLs 64 are formed in dielectric layer 60. The respective step is also shown as step 216 in the process flow shown in FIG. 16. In accordance with some embodiments of the present disclosure, the formation of RDLs 64 includes forming a blanket copper seed layer, forming and patterning a mask layer over the blanket copper seed layer, performing a plating to form RDLs 64, removing the mask layer, and etching the portions of the blanket copper seed layer not covered by RDLs 64. RDLs 64 may also be formed of a metal or a metal alloy including aluminum, copper, tungsten, and/or alloys thereof. It is appreciated that although in the illustrated exemplary embodiments, two layers of RDLs (58 and 64) are formed, the RDLs may have any number of layers such as one layer or more than two layers. The RDLs in combination may electrically interconnect through-conductors 32, device dies 38, passive devices 56, and the like.

Figure 11:
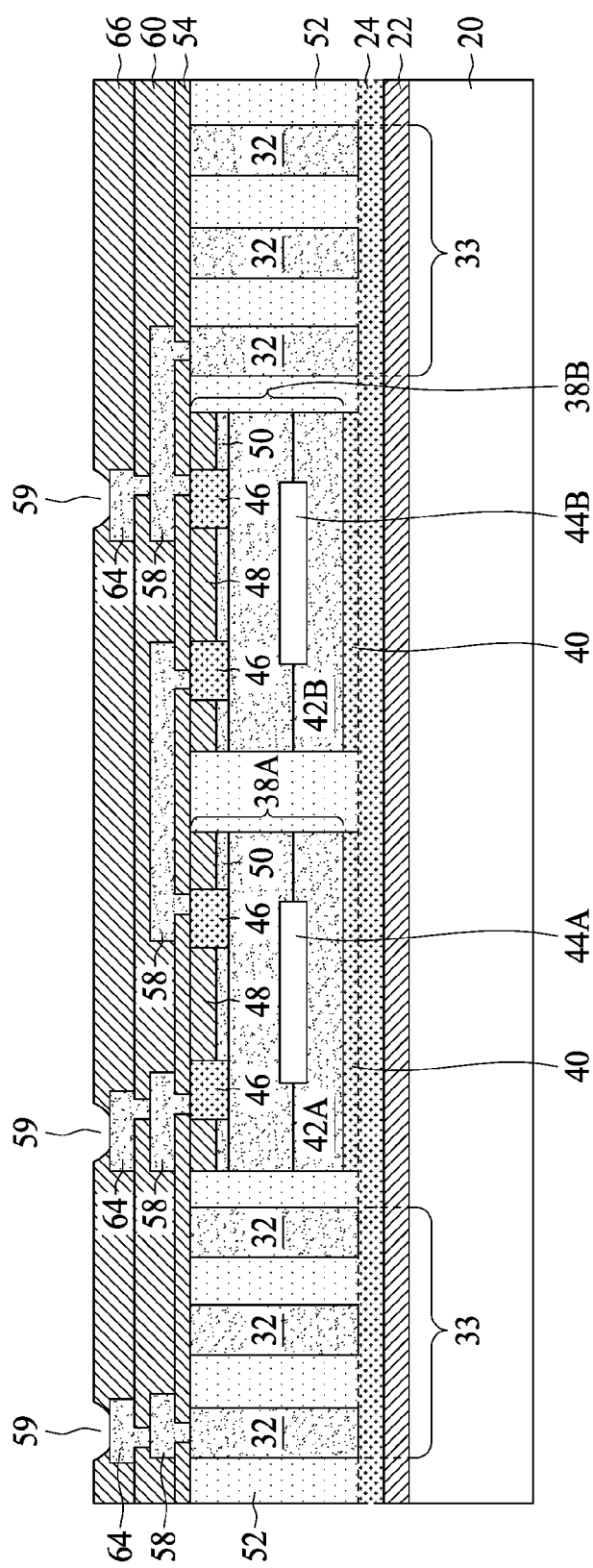
Figure 12:
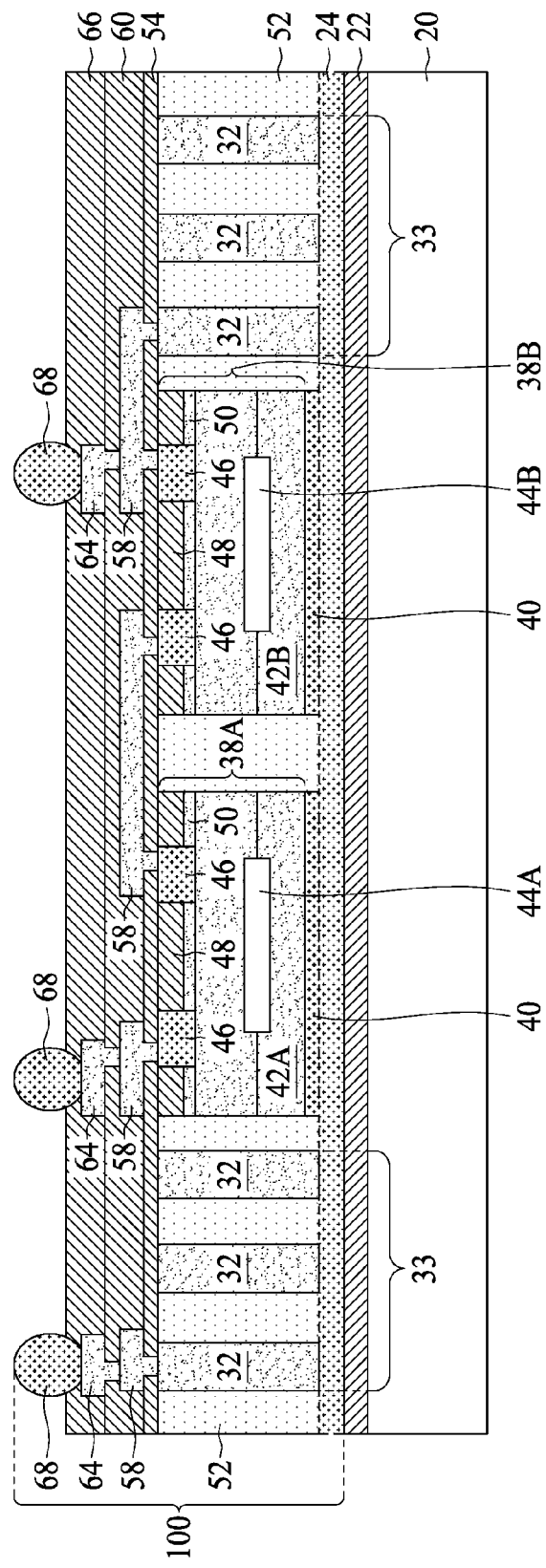

FIGS. 11 and 12 illustrate the formation of dielectric layer 66 and electrical connectors 68 in accordance with some exemplary embodiments. The respective step is shown as step 218 in the process flow shown in FIG. 16. Referring to FIG. 11, dielectric layer 66 is formed, for example, using PBO, polyimide, or BCB. Openings 59 are formed in dielectric layer 66 to expose the underlying metal pads, which are parts of RDLs 64. In accordance with some embodiment, Under-Bump Metallurgies (UBMs, not shown) are formed to extend into opening 59 in dielectric layer 66.

Electrical connectors 68 are then formed, as shown in FIG. 12. The formation of electrical connectors 68 may include placing solder balls on the exposed portions of the UBMs, and then reflowing the solder balls. In accordance with alternative embodiments of the present disclosure, the formation of electrical connectors 68 includes performing a plating step to form solder regions over the exposed metal pads in RDLs 64, and then reflowing the solder regions. Electrical connectors 68 may also include metal pillars, or metal pillars and solder caps, which may also be formed through plating. Throughout the description, the structure including dielectric layer 24 and the overlying structure in combination is referred to as package 100, which is a composite wafer including a plurality of device dies 38.

Next, package 100 is de-bonded from carrier 20, for example, by projecting a UV light or a laser beam on release layer 22, so that release layer 22 decomposes under the heat of the UV light or the laser beam. Package 100 is thus de-bonded from carrier 20. The resulting package 100 is shown in FIG. 13. In accordance with some embodiments of the present disclosure, in the resultant package 100, dielectric layer 24 remains as a bottom part of package 100, and protects through-conductors 32. Dielectric layer 24 may be a blanket layer with no through-opening therein. In accordance with alternative embodiments, dielectric layer 24 is not formed, and the bottom surfaces of encapsulating material 52 and through-conductors 32 are exposed after the de-bonding. A backside grinding may (or may not) be performed to remove DAFs 40, if they are used, so that the bottom surfaces of through-conductors 32 are coplanar with the bottom surfaces of device dies 38A and 38B. The bottom surface of device dies 38A and 38B may also be the bottom surfaces of semiconductor substrates 42A and 42B.

FIG. 14 illustrates the bonding of passive devices 56B to package 100. The respective step is shown as step 220 in the process flow shown in FIG. 16. In FIG. 14, passive devices 56B overlap device dies 38A and 38B. Some passive devices 56B may also overlap passive devices 56A. Passive devices 56B are also referred to as surface-mount devices since they are mounted on the top surface of package 100. Passive devices 56B may be capacitors, resistors, inductors, and/or the like. Passive devices 56B may be IPDs formed on semiconductor substrates. Furthermore, in accordance with some embodiments, there are no active devices such as transistors and diodes in passive devices 56B. In accordance with some embodiments, either embedded passive devices 56A, surface-mounted passive devices 56, or both, are adopted in package 100. Accordingly, passive devices 56A and 56B are shown as dashed to indicate they may or may not be formed. Embedding passive devices 56A or bonding passive devices 56B on top of RDLs have their own advantageous features. For example, when passive devices 56A are adopted while no passive devices 56B are bonded, the total thickness of package 100 may be reduced. On the other hand, bonding passive devices 56B may reduce the area of package 100. Accordingly, either the embedded passive devices 56A, the surface-mounted passive devices 56B, or both, are adopted in package 100 to suit to different design requirements. Passive devices 56A and 56B may be electrically coupled to device dies 38A and/or 38B through RDLs 64 and 58.

Package 100 is then singulated in accordance with some embodiments of the present disclosure, and package 100 is sawed into a plurality of packages 100' that is identical to each other. FIG. 15 illustrates a top view of an exemplary package 100'. In accordance with some exemplary embodiments, package 100' includes four edges 100A. The cross-sectional view shown in FIG. 13 is obtained from the plane containing line 13-13 in FIG. 15. The cross-sectional view shown in FIG. 14 is obtained from the plane containing line 14-14 in FIG. 15. Inductor 33 has four sides that are proximal to the respective edges 100A. Furthermore, there may not be any device located between inductor 33 and edges 100A. Ports 34 of inductor 33 are connected to device die 38A through RDLs 58/64. Device dies 38A and 38B are encircled by coil 33 (and the respective through-conductors 32), wherein no device die and no passive device is outside of coil 33, so that the area of package 100' is minimized. Passive devices 56 (including 56A and/or 56B) are also encircled by (in the top view of package 100') inductor 33. Referring to FIG. 15, in accordance with some embodiments, length L1 of coil 33 (which is the longest length of the concentric rings) is in the range between about 50% and about 99% of length L2 of package 100' (which is also the length of encapsulating material 52). The shortest length L3 of the concentric rings is about 30% to about 70% of length L2. The occupied area of coil 33 (including the central area surrounded by coil 33) may be between about 25% and about 98% of the top-view area of package 100'. The ratio of width W1/H1 (FIG. 14) may be in the range between about 0.4 and about 1.5.

FIG. 14 also illustrates seal ring 70 formed in dielectric layers 54, 60 and 66. Seal ring 70 is formed simultaneously as the formation of RDLs 58 and 64. In a top view of package 100', seal ring 70 encircles coil 33, and is formed between coil 33 and the respective edges of package 100' (FIG. 15, wherein seal ring 70 is not shown). Seal ring 70 may be electrically grounded or electrically floating.

Figure 17:
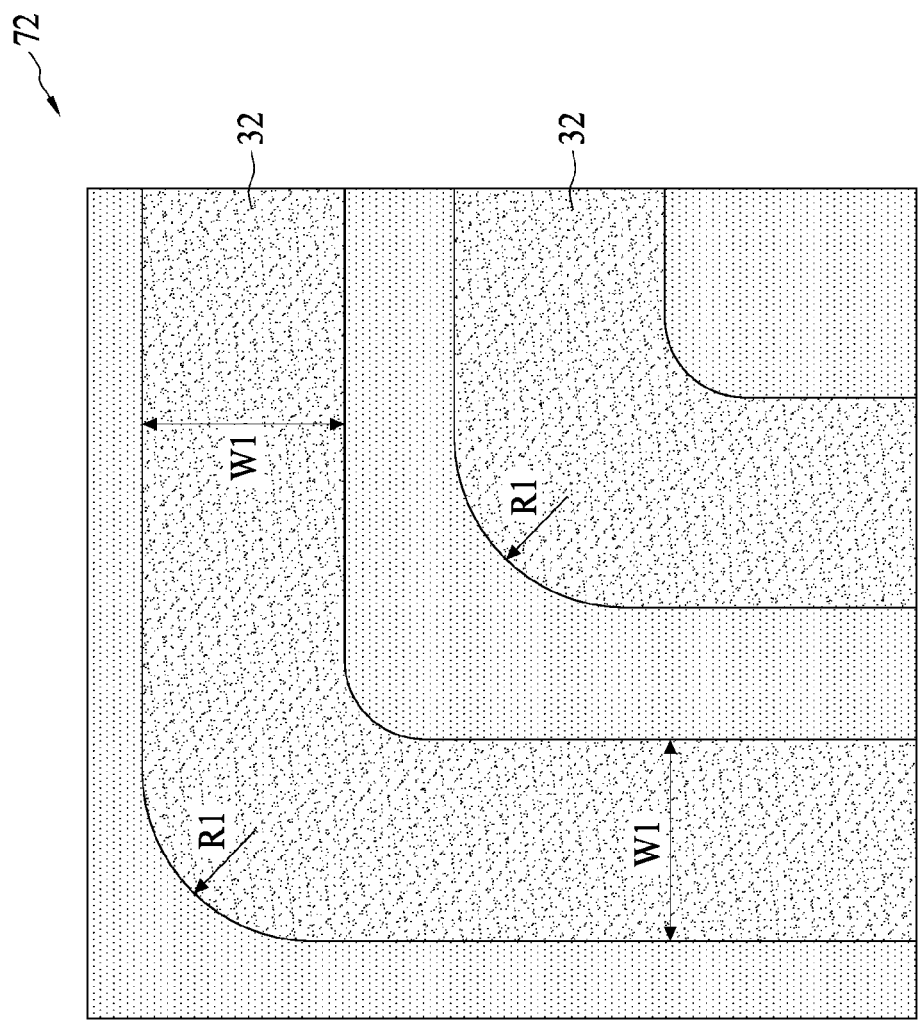
FIG. 17 illustrates a portion of the coil in accordance with some embodiments.

FIG. 17 illustrates an amplified view of portion 72 of package 100' in FIG. 15, wherein two through-conductors 32 are illustrated as an example. To reduce stress, through-conductors 32 may have rounded corners. For example, the radius R1 of through conductors may be in the range between about W1/2 and 2W1/3.

To enhance the efficiency, the outer rings of coil 33 may have widths greater than or equal to the width of the widths of the inner rings in accordance with some embodiments. For example, referring to FIG. 15, width W1A, which may be the width of the outmost ring, may be equal to or greater than width W1B of the innermost ring. Ratio W1B/W1A may be in the range between about ½ and about ⅔. Furthermore, from outer rings to the inner rings, the widths of through-conductors 32 may be increasingly reduced or periodically reduced every several rings.

Figure 18:
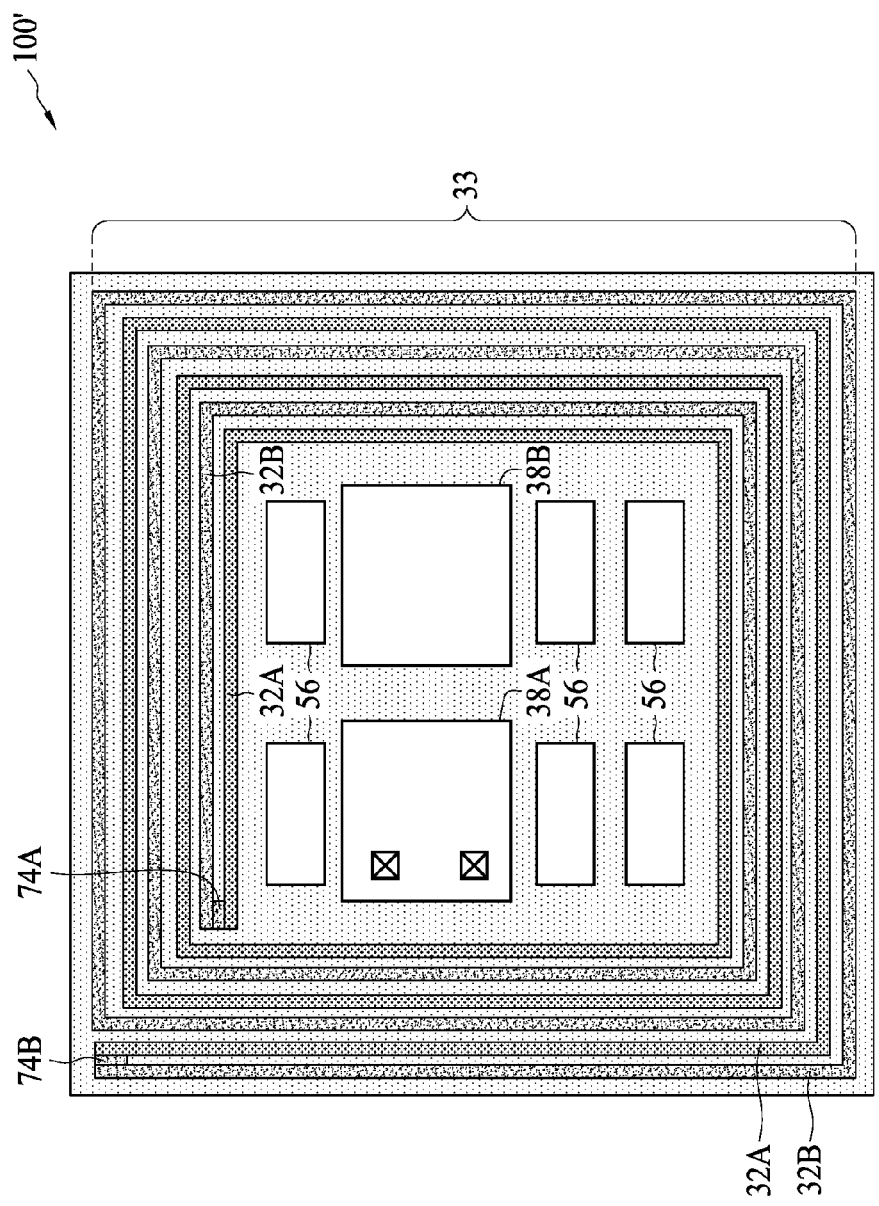
FIG. 18 illustrates a double-line coil in accordance with some embodiments.

FIG. 18 illustrates package 100' including a double-line coil 33 in accordance with some embodiments. For a clearer view, RDLs 58 and 64 (FIG. 15) that connect the ends of coil 33 to device die 38A are not illustrated in FIG. 18. The structure in FIG. 18 is essentially the same as shown in FIG. 15, except that coil 33, instead of having a single through-conductor 32 coiling, has two through-conductors 32A and 32B coiling in parallel. Through-conductors 32A and 32B are parallel to each other, and are in combination used like a single conductor to form coil. In order to distinguish through-conductors 32A from 32B, so that their layouts can be clearly seen, through-conductors 32A and 32B are shown using different patterns.

As shown in FIG. 18, each of through-conductors 32A and 32B by itself forms a coil. The ends of through-conductors 32A and 32B are interconnected through connectors 74A and 74B. Each of connectors 74A and 74B may be a through-via formed simultaneously when through-conductors 32A and 32B are formed, or may be a part of RDLs 58 and 64. Connectors 74A and 74B may also include both the through-conductor portion and the RDL portion. In accordance with some embodiments, through-conductors 32A and 32B are only connected at their ends, but not in the middle, as shown in FIG. 18. In accordance with alternative embodiments, additional connectors similar to connectors 74A and 74B may be formed periodically to interconnect the middle portions of through-conductor 32A to the respective middle portions of through-conductor 32A. For example, each straight portion of through-conductors 32A and 32B may include one or more interconnector.

As a result of the interconnection of through-conductors 32A and 32B, through-conductors 32A and 32B in combination form the coil. When operated at a high frequency, for example, several megahertz or higher, coil 33 in FIG. 18 has the performance comparable to, and sometimes better than, bulk coil 33 as shown in FIG. 15. This may be caused by skin effect. Furthermore, with through-conductors 32A and 32B being narrower compared to a bulk coil since it is equivalent to removing a middle part of through-conductor 32 as shown in FIG. 15, the pattern loading effect in the plating of through-conductors 32A and 32B is reduced.

The embodiments of the present disclosure have some advantageous features. By embedding (active) device dies and embedding and/or bonding passive devices (dies) in the region encircled by the inductor, the area of the wireless charger is reduced. It is realized that conventionally, device dies and passive devices cannot be placed inside the inductor since this will cause the loss of the efficiency of power receiving to an unacceptable level. In accordance with some embodiments of the present disclosure, by reducing the pitch of inductor 33, the receiving efficiency if improved, which compensates for the loss in the efficiency caused by placing device dies and passive device in the region encircled by the inductor. The receiving efficiency is thus increased to an acceptable level.

In accordance with some embodiments of the present disclosure, a package includes a device die, and an encapsulating material encapsulating the device die therein. The encapsulating material has a top surface coplanar with a top surface of the device die. A coil extends from the top surface to a bottom surface of the encapsulating material, and the device die is in the region encircled by the coil. At least one dielectric layer is formed over the encapsulating material and the coil. A plurality of redistribution lines is in the at least one dielectric layer. The coil is electrically coupled to the device die through the plurality of redistribution lines.

In accordance with some embodiments of the present disclosure, a package includes a coil extending to proximal all edges of the package, a device die inside the coil, an encapsulating material encapsulating the device die and the coil therein, at least one dielectric layer over the encapsulating material and the coil, and a plurality of redistribution lines in the at least one dielectric layer. The plurality of redistribution lines is electrically coupled to the coil and the device die.

In accordance with some embodiments of the present disclosure, a method includes forming a coil over a carrier, and placing a device die over the carrier, wherein the device die is in a region encircled by the coil. The method further includes encapsulating the device die and the coil in an encapsulating material, planarizing a top surface of the first device die and a top end of the coil with a top surface of the encapsulating material, forming at least one dielectric layer over the encapsulating material, the coil, and the first device die, and forming a plurality of redistribution lines in the at least one dielectric layer. The plurality of redistribution lines is electrically coupled to the first device die and the coil.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first device die;
    an encapsulating material encapsulating the first device die therein, wherein the encapsulating material has a top surface coplanar with a top surface of the first device die;
    a coil extending from the top surface to a bottom surface of the encapsulating material, wherein the first device die is in a region encircled by the coil;
    at least one dielectric layer over the encapsulating material and the coil; and
    a plurality of redistribution lines in the at least one dielectric layer, wherein the coil is electrically coupled to the first device die through the plurality of redistribution lines.

2. The package of claim 1, wherein no device die is disposed outside of the coil.

3. The package of claim 1, wherein the first device die is an AC-DC converter, and the AC-DC converter is configured to receive a power received by the coil and convert the power from AC to DC, and the package further comprises a second device die, wherein the second device die comprises a Bluetooth circuit.

4. The package of claim 1, wherein the coil is a double-line coil including two conductors connected in parallel, and opposite ends of a first one of the two conductors are interconnected to respective opposite ends of a second one of the two conductors.

5. The package of claim 1 further comprising an Integrated Passive Device (IPD) over the plurality of redistribution lines, wherein the IPD is encircled by the coil in a top view of the package.

6. The package of claim 1 further comprising an additional Integrated Passive Device (IPD) encapsulated in the encapsulating material, wherein the additional IPD is encircled by the coil, and the additional IPD is separated from the first device die.

7. The package of claim 1, wherein an axis of the coil is perpendicular to a major bottom surface of the first device die.

8. A package comprising:
    a coil extending to proximal all edges of the package;
    a first device die inside the coil;

an encapsulating material encapsulating the first device die and the coil therein;
at least one dielectric layer over the encapsulating material and the coil; and
a plurality of redistribution lines in the at least one dielectric layer, wherein the plurality of redistribution lines is electrically coupled to the coil and the first device die.

9. The package of claim 8, wherein a top surface of the first device die, a top end of the coil, and a top surface of the encapsulating material are coplanar with each other.

10. The package of claim 8, wherein the coil penetrates through the encapsulating material, and the package further comprises a die-attach film attached to a back surface of the first device die, with a bottom surface of the die-attach film, a bottom surface of the encapsulating material, and a bottom end of the coil being are coplanar with each other.

11. The package of claim 8, wherein no device die is outside of the coil.

12. The package of claim 8, wherein the first device die is an AC-DC converter, and the AC-DC converter is configured to receive a power received by the coil and convert the power from AC to DC.

13. The package of claim 8 further comprising a second device die, wherein the second device die comprises a Bluetooth circuit.

14. The package of claim 8, wherein an axis of the coil is perpendicular to a major bottom surface of the first device die.

15. The package of claim 14 further comprising an additional integrated passive device encapsulated in the encapsulating material, wherein the additional integrated passive device is encircled by the coil, and the additional integrated passive device is separated from device die.

16. A method comprising:
forming a coil over a carrier;
placing a first device die over the carrier, wherein the first device die is in a region encircled by the coil;
encapsulating the first device die and the coil in an encapsulating material;
planarizing a top surface of the first device die and a top end of the coil with a top surface of the encapsulating material;
forming at least one dielectric layer over the encapsulating material, the coil, and the first device die; and
forming a plurality of redistribution lines in the at least one dielectric layer, wherein the plurality of redistribution lines is electrically coupled to the first device die and the coil.

17. The method of claim 16 further comprising bonding an integrated passive device over and electrically coupling to the plurality of redistribution lines, wherein in a top view of the plurality of redistribution lines, the integrated passive device is encircled by the coil.

18. The method of claim 16 further comprising placing an additional integrated passive device over the carrier, with the additional integrated passive device encapsulated by the encapsulating material, wherein the additional integrated passive device is encircled by the coil.

19. The method of claim 16 further comprising performing a singulation to separate the coil and the first device die into a package separated from other packages, wherein after the singulation, no device die and passive device is outside of the coil.

20. The method of claim 16, wherein an axis of the coil is perpendicular to a major bottom surface of the first device die.

* * * * *